United States Patent [19]

Morrison

[11] Patent Number: 4,580,138

[45] Date of Patent: Apr. 1, 1986

[54] MEASUREMENT-EXPRESSING APPARATUS

[75] Inventor: John M. Morrison, Edinburgh, Scotland

[73] Assignee: Ferranti plc, Cheshire, England

[21] Appl. No.: 456,694

[22] Filed: Jan. 10, 1983

[30] Foreign Application Priority Data

Jan. 30, 1982 [GB] United Kingdom ............... 8202706

[51] Int. Cl.$^4$ .................. H04Q 9/00; G08B 25/00
[52] U.S. Cl. ........................ 340/825.78; 340/524; 340/825.36; 340/870.38
[58] Field of Search ............ 340/870.38, 518, 825.78, 340/825.37, 825.36, 524

[56] References Cited

U.S. PATENT DOCUMENTS

| 3,922,490 | 11/1975 | Pettis | 340/870.38 |
| 4,050,062 | 9/1977 | Crocker et al. | 340/825.57 |
| 4,118,700 | 10/1978 | Lenihan | 340/524 |
| 4,484,290 | 11/1984 | Bagnall et al. | 340/518 |

Primary Examiner—Donald J. Yusko
Attorney, Agent, or Firm—Kerkam, Stowell, Kondracki & Clarke

[57] ABSTRACT

Measurement-expressing apparatus for monitoring (n) switches, the state of each switch representing the state of a station, has a resistor in parallel with each switch, the (n) resistors having binary related resistances, a constant current is supplied to the parallel combinations of switches and resistors connected in series with each other, and signals each representative of the sum of the voltage drops within the series of parallel combinations are operated upon by an n-bit analogue-to-digital converter, the (n) outputs of the converter each being individually associated with a parallel combination, in each quantization period (t) of the converter, a signal is obtained on each converter output representative of one of the two possible states of the corresponding station, and signals of one form, provided on at least one output individually are accumulated in a counter over an interval (mt). The numbers accumulated by any counter in each of a plurality (p) of intervals (mt) are operated upon.

3 Claims, 1 Drawing Figure

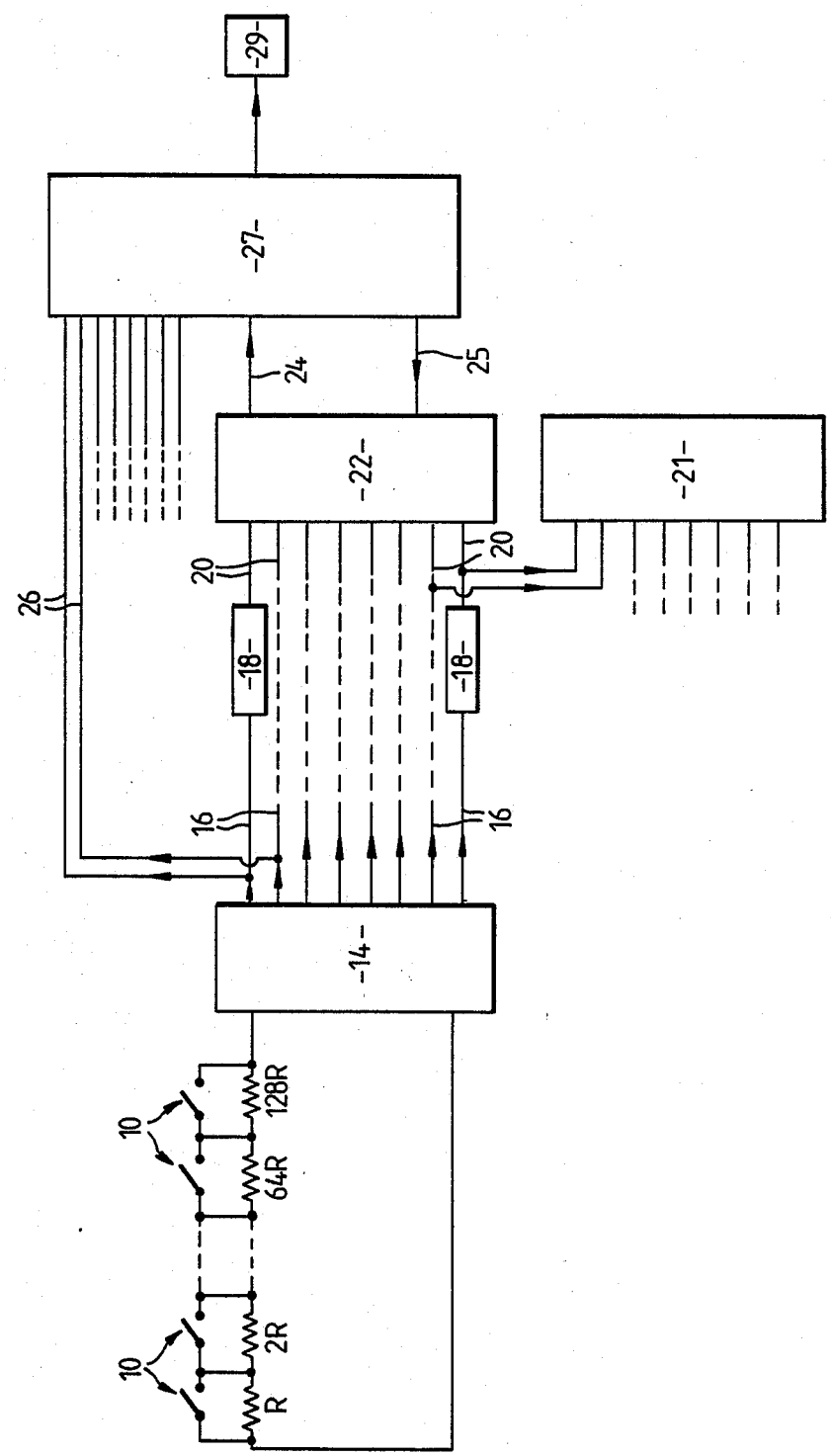

MEASUREMENT-EXPRESSING APPARATUS

This invention relates to measurement-expressing apparatus, for monitoring the state of activity of a plurality of stations.

It is an object of the present invention to provide novel and advantageous measurement-expressing apparatus, for monitoring the state of activity of a plurality of stations, the state of activity of each station being represented by the opening or the closing of a switch, and being represented by the signals obtained from a corresponding output of a common analogue-to-digital converter connected to the stations.

According to the present invention measurement-expressing apparatus for monitoring the state of activity of a plurality (n) stations, the arrangement being such that the state of activity of each station is to be represented by the state, comprising either the opening or the closing, of an electrical switch of the apparatus, and individually associated with the station, in the apparatus each electrical switch is in parallel with a resistor, and the plurality (n) resistors have different resistances which are binary related to each other, the parallel combinations, each of an electrical switch and a resistor, are connected in series, a source is connected to the series of parallel combinations to supply a constant current thereto, the current flow being directed through an electrical switch if the switch is closed, and the series of parallel combinations is connected to the input of a common, n-bit, analogue-to-digital converter, having (n) outputs, each output individually being associated with a parallel combination, different parallel combinations being associated with different converter outputs, the converter being arranged to be capable of determining, in each consecutive quantisation period (t) associated with the repetitive operation of the converter, any instantaneous voltage drop across each parallel combination, in response to the converter receiving an input signal representative of an instantaneous sum of the voltage drops across the plurality (n) parallel combinations, in response there being obtained on each of the corresponding converter outputs a signal of one of two possible forms, and resentative of the state of the corresponding electrical switch, and each converter output is connected individually to a counter to accumulate the number of signals received from the associated converter output of one of the two possible forms in each of consecutive intervals (mt), where (m) is an integer greater than ne, and the apparatus includes means to record and/or to dicate the number accumulated in at least one provided counter in such an interval.

The period (t) associated with the repetitive operation of the converter comprises the quantisation period associated with the converter, the signal representative of the instantaneous sum of the voltage drops across the plurality (n) parallel combinations at the start of each of the consecutive quantisation periods solely being operated upon by the converter in the corresponding quantisation period, in the known manner for conventional analogue-to-digital converters.

Thus, there can be obtained from the apparatus a representation of the approximate proportion or proportions of each interval (mt), in which proportion or proportions any of the (n) electrical switches is either open, or closed.

This arrangement for measurement-expressing apparatus is advantageously simple, because the stations to be monitored are connected together by a single wire, and there is only one input to the common analogue-to-digital converter.

Conveniently, there is recorded and/or indicated the number accumulated in each of (n) provided counters in an interval (mt).

The apparatus may include data processor means arranged to operate, in any required manner, upon the numbers accumulated in any counter in a plurality (p) of intervals (mt), the apparatus also including means to record and/or to indicate the corresponding output signals of the data processor means. The data processor means may be arranged to operate, in any required manner, upon the numbers accumulated simultaneously in each of the (n) counters, in each of a plurality of consecutive intervals (mt).

The present invention will now be described by way of example with reference to the accompanying drawing, comprising a block circuit diagram of one embodiment of measurement-expressing apparatus in accordance with the present invention.

The illustrated measurement-expressing apparatus is to monitor the state of activity of a plurality (n) stations. The state of activity of each station is to be represented by the state, comprising either the opening or the closing, of an electrical switch included in the apparatus, and individually associated with the station. The stations are not illustrated. Thus, two possible states of activity of each station can be monitored, the arrangement being such that the associated electrical switch is closed when the station is in one of the two possible states, and is open when the station is in the other state.

The apparatus also includes a plurality (n) resistors, having different resistances which are binary related to each other. In the illustrated arrangement eight resistors, and eight switches 10, are provided, and the resistors are indicated as R, 2R ... 64R, 128R. Each resistor, individually, is in parallel with a switch 10. The parallel combinations, each of a resistor and a switch, are connected in series with each other. In the illustrated arrangement the resistors are connected together in an order in accordance with their resistances, but this is not essential.

A constant current source, not shown, is connected to the series of parallel combinations of switches and resistors. If a switch is closed, the current flow is directed through the switch, and there is no significant voltage drop across the parallel combination. If a switch is open, there is a voltage drop across the parallel combination, there being different, possible, binary-related, voltage drops across the different parallel combinations.

The series of parallel combinations is connected to the input of a conventional, n-bit, analogue-to-digital converter 14. Conveniently, the constant current source is provided within the converter 14. The series of parallel combinations comprises a loop circuit extending from the converter. Thus, there are provided at the input of the converter voltage input signals, each representative of the complement of a sum of the voltage drops across the plurality (n) parallel combinations, and the converter is capable of operating upon each such voltage input signal to provide a corresponding output comprising a binary digital representation thereof. Such an output signal is provided at (n) outputs of the converter, these outputs being indicated by lines 16 in the FIGURE. Hence, each converter output 16 individually is associated with a corresponding one of the binary-related resistances, different outputs being associated with different corresponding resistances. Further, each converter output 16 individually is associated with a corresponding switch 10, and, consequently, with a corresponding station.

In the operation of the apparatus, if a switch is closed, a signal, representative of either a binary '1', or a binary '0', and representative of this state, is obtained at the corresponding converter output, and if the switch is closed the other possible binary signal form is obtained at the converter output. Thus, there is obtained a binary signal representative of the state of activity of the corresponding station. Such binary signals are obtained simultaneously on each of the converter outputs, representative of the states of activity of the corresponding (n) stations.

In the known manner of operation of an analogue-to-digital converter there is a quantisation period (t), and the converter operates in a repetitive manner, performing the required digitisation step in each of consecutive periods (t). At the start of each quantisation period the instantaneous voltage input signal to the converter is sampled, and it is this voltage which is converted into (n) binary signals from the converter outputs.

The apparatus also includes (n) counters 18 to accumulate the binary '1''s or '0''s, on each of the converter outputs 16, in an interval (mt), where m is an integer greater than one. For example, the period (t) is 1 second, and m is 60, each consecutive interval being 1 minute. Hence, counters each with at least sixty stages are provided, capable of counting up to sixty binary signals, of one of the two possible forms from the converter outputs. Thus, the number accumulated in each counter, in each interval (mt), is a representation of the approximate proportion of the interval which the corresponding switch is either open, or closed, the complement of this number being representative of the approximate proportion of the interval the corresponding switch is in the other of its two possible states. A signal representative of one such proportion is obtained from one output of the counter, indicated by a lead 20. Such signals are obtained simultaneously from the (n) counter outputs 20, and correspond to the (n) stations.

The apparatus also includes conventional means 21 to record and/or to indicate the proportions represented by the counter output signals. For convenience, only two counters 18 are shown connected to the means 21 to record and/or to indicate. Such means may be arranged other than as illustrated, conveniently common such means being provided, connected to the (n) counter outputs 20 via multiplexing means, indicated generally at 22. The output of the multiplexing means 22 is on a line 24, and the multiplexing means is controlled by signals received on a line 25 from the means connected to the multiplexing means. Synchronising signals, to control the operation of the means connected to the multiplexing means, are provided on lines 26 extending from points between the converter outputs 16 and the counters 18, only two lines 26 being illustrated.

Possibly only one counter is provided, the multiplexing means 22 being provided between the converter outputs and the counter.

The apparatus may also include data processor means 27, arranged to operate upon the numbers accumulated in any counter in a plurality (p) of intervals (mt), and the apparatus also including means 29 to record and/or to indicate the corresponding output signals of the data processor means 27, for example, the means 27 comprising a time controlled adder, arranged to provide a histogram type output on a display. Conveniently, the data processor means 27 is arranged to operate, in any required manner, upon the numbers accumulated simultaneously in each of the (n) counters, in each of a plurality of intervals (mt). Thus, the data processor means is connected to the output 24 from the multiplexing means 22, it receives the synchronising signals on the lines 26, and signals from the data processor means are supplied to control the multiplexing means on the line 25.

Data storage means may be included, where appropriate, within the apparatus in accordance with the present invention, the data processor means being connected to the data storage means, to receive data to be operated upon therefrom, instead of the data processor means being connected, for example, to the multiplexing means 22.

The stations may comprise machines, the manners of operation of which machines are required to be monitored. There may be more than one station included in a machine to be monitored.

What we claim is:

1. Measurement-expressing apparatus for monitoring the state of each of a plurality n of stations, said apparatus comprising:

a plurality n of electrical switches corresponding to the stations, each switch capable of an open state and a closed state, with the state of each switch representing the state of the corresponding station;

a plurality n of resistors having different resistances which are binary related to each other, each resistor being connected electrically in parallel with a corresponding switch, and the resultant plurality of parallel combinations of switches and resistors being connected electrically in series;

a constant current source connected to the series of parallel combinations to drive a constant current therethrough, current flowing through each resistor whose corresponding switch is open such that a voltage drop is produced thereacross, and current being diverted through switches which are closed;

an n-bit analogue-to-digital converter having n outputs and having an input connected to the series of parallel combinations so as to respond to the sum of the voltage drops across those of said resistances whose corresponding switches are not closed, said analogue-to-digital converter having a quantisation period t required for performing a conversion and capable of repetitively operating over successive quantisation periods to sample the input voltage at the beginning of each quantisation period and to provide an n-bit binary-weighted output at the end of each quantisation period;

the values of said resistances, the magnitude of the constant current and said analogue-to-digital converter being selected such that each of said n converter outputs corresponds to an individual one of said parallel combinations and the state of each of said n converter outputs represents the state of the corresponding switch; and a plurality n of counting means respectively connected to corresponding ones of said n converter outputs for accumulating, during each of a plurality of consecutive intervals mt, where m is an integer greater than one, the number of signals received from the corresponding converter output indicative of one of the two possible states, whereby the number accumulated in each of said counting means during each interval mt represents the approximate proportion of the interval mt during which the corresponding switch is either open or closed.

2. Apparatus in accordance with claim 1, which further comprises means for indicating the number accumulated in at least one of said counting means during the interval mt.

3. Apparatus in accordance with claim 1, wherein said plurality n of counting means comprises n individual counters.

* * * * *